United States Patent [19]

Takla

[11] Patent Number: 5,570,054

[45] Date of Patent: Oct. 29, 1996

[54] METHOD AND APPARATUS FOR ADAPTIVE CLOCK DESKEWING

[75] Inventor: Ashraf K. Takla, San Jose, Calif.

[73] Assignee: Hitachi Micro Systems, Inc., San Jose, Calif.

[21] Appl. No.: 312,355

[22] Filed: Sep. 26, 1994

[51] Int. Cl.$^6$ .................................. H03K 5/13; H03K 3/01
[52] U.S. Cl. .......................... 327/292; 327/295; 327/141; 327/158
[58] Field of Search ........................... 327/141, 144–150, 327/152, 153, 155–159, 161, 231, 233–237, 243–245, 248–251, 292–298; 331/17

[56] References Cited

U.S. PATENT DOCUMENTS

| | | | |
|---|---|---|---|
| 3,189,835 | 6/1965 | Marsh | 327/153 |
| 4,595,927 | 6/1986 | Menick | 327/147 |
| 4,626,787 | 12/1986 | Mefford | 327/156 |
| 4,661,721 | 4/1987 | Ushiku | 327/297 |
| 4,926,066 | 5/1990 | Maini et al. | 327/292 |
| 4,998,262 | 3/1991 | Wiggers | 327/261 |
| 5,043,596 | 8/1991 | Masuda et al. | 327/295 |
| 5,122,679 | 6/1992 | Ishii et al. | 327/147 |
| 5,216,302 | 6/1993 | Tanizawa | 327/157 |
| 5,223,755 | 6/1993 | Richley | 327/158 |
| 5,254,886 | 10/1993 | El-Ayat et al. | 327/297 |
| 5,258,660 | 11/1993 | Nelson et al. | 327/141 |
| 5,274,677 | 12/1993 | Ohuchi et al. | 327/261 |
| 5,361,277 | 11/1994 | Grover | 327/144 |
| 5,408,200 | 4/1995 | Buhler | 327/158 |
| 5,430,397 | 7/1995 | Itoh et al. | 327/295 |

*Primary Examiner*—Timothy P. Callahan
*Assistant Examiner*—T. Lam
*Attorney, Agent, or Firm*—Graham & James LLP

[57] ABSTRACT

A system clock signal is distributed to a plurality of load devices via a plurality of phase correction circuits each coupled to a different pair of a plurality of pairs of clock signal conductors. The proximal end of one of the pair of conductors is coupled to the output of a delay line and receives a phase corrected version of the system clock signal. The distal end of this conductor is coupled to the load device at a clock connection node. The clock connection node is fed back to the phase correction circuit via the other one of the pair of conductors. The first and second conductors have equal path lengths in order to provide equal propagation delays. The clock signal fed back from the load device node is coupled as a feedback input to a three input phase detector circuit. The other two inputs are the clock signal output from the phase correction circuit delay line and the system clock signal. Each phase correction circuit includes a charge pump coupled to the output of the phase detector circuit, and a loop filter coupled to the output of the charge pump. The output of the loop filter is coupled to the input of the delay line. Each phase correction circuit is identically configured and the system clock signal is commonly provided to both the input of the phase detector in each phase correction circuit and a delay line clock reference input.

14 Claims, 3 Drawing Sheets

METHOD AND APPARATUS FOR ADAPTIVE CLOCK DESKEWING

BACKGROUND OF THE INVENTION

This invention relates to clock deskewing techniques used in synchronous electronic systems.

In a synchronous electronic system, a master clock is normally provided which is used to synchronize the different components of the system requiring timed operation. In typical systems of this type, the master clock experiences delays along the distribution network, which results in loss of clock margin and potential errors. In the past, the normal solution employed to address this variable delay problem has been to slow down the master clock to accommodate delay variations. This solution suffers from the disadvantage that the entire system operation is prolonged, which slows down the processing time or operational time of the associated system circuits.

In order to attempt to provide a more suitable solution to the problem of variable clock delays, several techniques have been employed. One such technique employs a structured set of design rules in arranging the circuit components and clock path lengths to minimize delay variations from the clock source to the various load destinations. Another technique employed in the past provides a plurality of phase lock loops or delay lock loops in order to provide zero delay buffers in the various clock distribution paths. In this approach, the phase lock loop or the delay lock loop is used to buffer the clock in such a manner that the clock can be used locally without undergoing any delay. Still another technique employed in the past has been to use phase lock loops or delay lock loops having a programmable delay output. In this approach, the system clock is provided as an input to the phase lock loop or the delay lock loop, and the output of the delay lock loop is a phase shifted version of the input system clock. The amount of the phase shift provided by the loop is programmed by the user so that any clock delay experienced along the path can be pre-compensated.

The above known techniques for variable delay clock compensation all suffer from the disadvantage of requiring an accurate prediction of the amount of delay caused by each clock distribution path. In addition, the solution employing a structured set of design rules introduces a constraint on the circuit layout which is not always compatible with other operational requirements of a synchronous electronic system.

SUMMARY OF THE INVENTION

The invention comprises a method and apparatus for providing adaptive clock deskewing which does not require either a structured set of design rules or an estimate of the amount of variable delay introduced by plurality of clock distribution paths. Further, the invention provides adaptive clock deskewing independently of the load devices, and independently of the length of the connecting leads to the loads. Still further, the invention is able to provide adaptive clock deskewing over a wide range of environmental conditions, such as temperature changes or load switching. In addition, the invention can be readily implemented at low cost using standard integrated circuit cells which are usually readily available from a library of such cells, such as charge pump, loop filter and delay line circuits.

From an apparatus standpoint, the invention comprises a clock deskewing circuit for synchronizing a clock signal at destination loads with a system clock independently of the loads, the length of the connecting leads to the loads and independently of environmental conditions. The circuit comprises a first input terminal for receiving a system clock signal, a plurality of pairs of clock signal conductors each having a proximal end and a distal end, and a plurality of phase correction circuits each having a first input coupled to the first input terminal, and second and third inputs coupled to a different one of the plurality of pairs of clock signal conductors. Each pair of clock signal conductors has individual proximal ends and common distal ends, and both conductors of a given pair have substantially the same path length. One conductor of each pair provides the system clock signal to a load device, while the other conductor of a given pair provides a distal clock feedback signal to the associated phase correction circuit.

Each phase correction circuit includes a phase detector circuit, a charge pump circuit coupled to the phase detector circuit, a loop filter coupled to the charge pump circuit, and a delay line having a first input coupled to the charge pump circuit, a second input coupled to the first input terminal, and an output coupled to the proximal end of the associated one of the clock signal conductors providing the system clock to the associated load device. Each phase correction circuit further includes a conductive lead coupled between the proximal end of the distal feedback clock signal conductor and one of the second and third inputs.

In an alternate embodiment, the invention further includes a master phase correction circuit coupled to the first input terminal and to the plurality of phase correction circuits for providing a master corrected version of the system clock signal and a control reference signal thereto. The master phase correction circuit includes a phase detector circuit; a charge pump circuit coupled to the phase detector circuit; a loop filter having an input coupled to the charge pump and an output; a first delay line having a first input coupled to the output of the loop filter, a second input for receiving the system clock signal, and an output; and a second delay line having a first input coupled to the output of the first delay line, a second input coupled to the output of the loop filter, and an output. The output of the second delay line is coupled to one of the second and third inputs of the phase correction circuit. The output of the loop filter and the output of the first delay line are coupled to the plurality of phase correction circuits. In this embodiment, each of the plurality of phase correction circuits is provided with a delay line having a first input, a second input, and an output coupled to the proximal end of the associated one of the clock signal conductors providing the system clock signals to the associated load device. Each of the phase correction circuits further includes a summing junction having a first input coupled to the output of the phase correction circuit loop filter, a second input coupled to the output of the master phase control circuit loop filter, and an output coupled to the first input of the delay line. The second input of the delay line is coupled to the output of the first delay line of the master phase correction circuit.

The invention may be applied to implement on-chip clock deskewing or chip-to-chip clock deskewing; and the only design constraint imposed by the invention is that the path length of the individual conductors of a given pair must be substantially equal.

For a fuller understanding of the nature and the advantages of the invention, reference should be made to the ensuing detailed description taken in conjunction with the accompanying drawings.

DETAILED DESCRIPTION OF THE PREFERRED EMBODIMENTS

Figure 1:
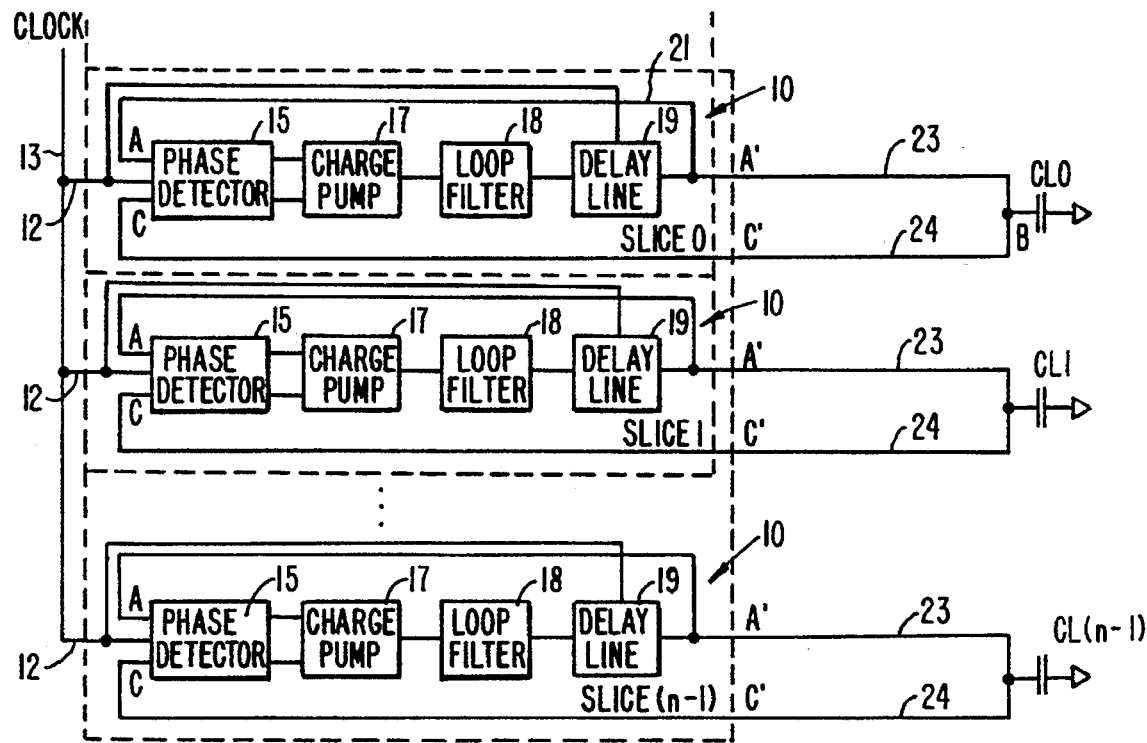
FIG. 1 is a block diagram illustrating a first embodiment of the invention.

Turning now to the drawings, FIG. 1 illustrates a block diagram of a first embodiment of the invention. As seen in this figure, a plurality of identically configured phase correction circuits 10 is provided with a first input terminal 12 to which a system clock signal is supplied along common conductor 13. Each phase correction circuit 10 includes a phase detector 15 having the characteristics described below, and a plurality of conventional components comprising a charge pump 17, a loop filter 18, and a delay line 19. System clock input terminal 12 is also coupled to an input of delay line 19 as a reference signal. The output of delay line 19 is coupled back as a first feedback signal along conductive path 21 to a first feedback input terminal designated with the reference letter A. The output of delay line 19 is also coupled to the proximal end A' of an outbound one of a pair of clock signal conductors 23 and 24. Clock signal conductor 23 is coupled at the distal end to a clock input terminal of a load device requiring a system clock input. This circuit connection point or node, designated with reference letter B, is also coupled to the distal end of inbound conductor 24. The proximal end C' of conductor 24 is connected to a feedback conductor 26 which is coupled at the other end to a second feedback input terminal designated with the reference letter C.

Each of conductors 23 and 24 of an individual pair has the same path length so that the signal delay along outbound conductor 23 is equal to the signal delay along conductor 24. The signal delay along conductor paths 21 and 26 between their connection points to nodes A' and C' and input feedback terminals A, C is considered negligible with respect to the signal delay along conductors 23 and 24. Consequently, these path lengths need not be equal.

In use, the feedback signal from node A', which is the near or proximal end feedback, comprises the immediate output of the delay line 19. The feedback input signal from node C' which is the distal end feedback, is the feedback clock signal after delivery to the destination load at device node B. The only constraint on the clock deskewing circuit layout is that the propagation delay from A' to B matches that from B to C' for any given pair of conductors 23, 24. However, the propagation delay may vary from pair to pair: i.e., the propagation delay along conductors 23, 24 of the uppermost phase correction circuit 10 may be different from that along conductors 23, 24 of the lowermost phase correction circuit 10. Thus, conductors 23, 24 of different lengths may be used to couple the phase adjusted clock signals to the individual load device nodes B. This assumes that the delay from A' to A and C' to C is negligible compared to the delay from A' to B or from B to C', which is normally the case. This delay matching can be readily accomplished in an integrated circuit environment by implementing conductors 23, 24 as a loop trace in which the path length from A' to B is identical to that from B to C'. One way of implementing this configuration is to provide a single metal trace having a width approximately three times the minimum metal conductor width, and forming a gap, e.g. by etching, in the single metal trace in order to form the loop.

Figure 2:
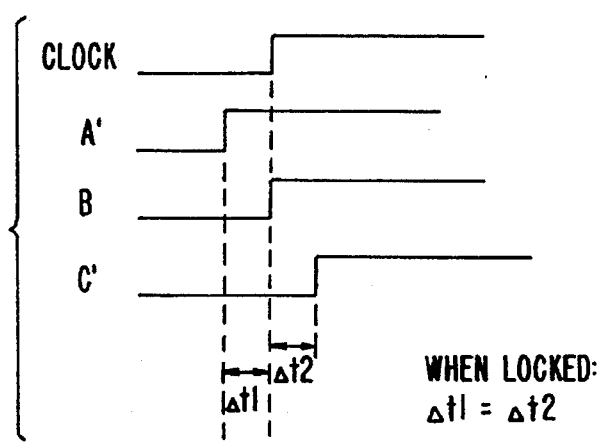
FIG. 2 is a timing diagram showing the phase correction circuit outputs referenced to the input system clock.

FIG. 2 is a clock signal diagram showing the relative positions of the clock signal on input terminal 12, the proximate feedback clock signal on node A', and the distal feedback clock signal on node C'. With reference to this figure, the phase detector 15 functions to provide correction signals to the charge pump 17 such that, when the loop is in lock, the clock input is centered equally between the feedback signal inputs A and C. This is automatically done by phase detector 15 by feeding the appropriate error correction signal to the charge pump 17 until such condition is satisfied. Since the clock signal at node B is also centered in phase between the clock signals on nodes A' and C', the clock signal at node B will be synchronized with the input clock signal.

Figure 3:
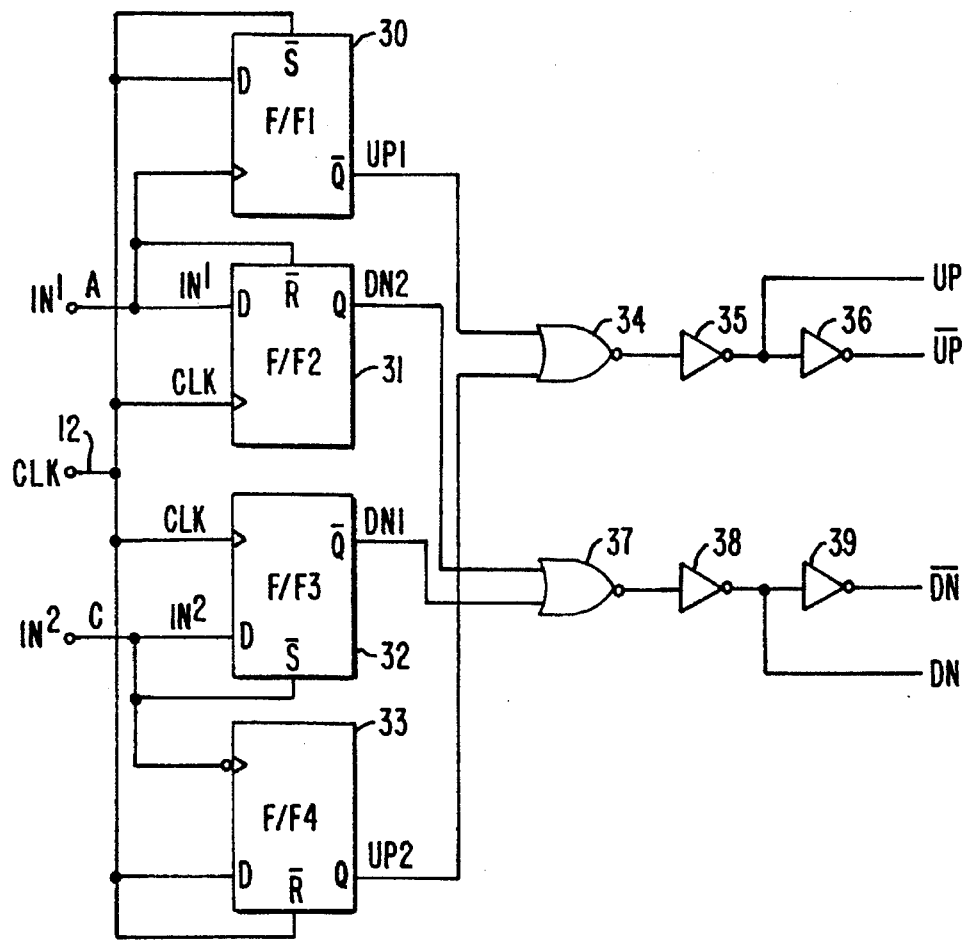
FIG. 3 is a logic diagram of an embodiment of phase detector 15.

FIG. 3 illustrates an embodiment of phase detector 15 capable of providing the error correction signals required to achieve loop lock in the manner described above. With reference to FIG. 3, four D-type flip-flops 30-33 are configured as shown. Thus, system clock input terminal 12 is coupled to the D input of flip-flops 30 and 33, and to the clock inputs of flip-flops 31, 32. Proximal clock signal feedback terminal A is coupled to the clock input of flip-flop 30 and the D input of flip-flop 31. Distal clock signal feedback terminal C is coupled to the D input of flip-flop 32 and the clock input of flip-flop 33. System clock input terminal 12 is further coupled to the set input of flip-flop 30 and the reset input of flip-flop 33. Proximal clock signal feedback terminal A is also coupled to the reset input of flip-flop 31. Distal clock signal feedback terminal C is also coupled to the set input of flip-flop 32.

The $\overline{Q}$ output of flip-flop 30 is coupled to a first input of an inverting or gate 34. The Q output of flip-flop 33 is coupled to the other input of gate 34. The output of gate 34 is coupled to the input of an inverter 35. The output of inverter 35 is coupled to the input of a second inverter 36.

Similarly, the Q output of flip-flop 31 is coupled to a first input of an inverting or gate 37; and the $\overline{Q}$ output of flip-flop 32 is coupled to the other input of gate 37. The output of gate 37 is coupled to the input of an inverter 38, and the output of inverter 38 is coupled to the input of a second inverter 39.

Flip-flops 30, 33 provide error steering signals designated UP1, UP2, which are buffered by gate 34 and inverters 35, 36 to provide the error correction signals UP and $\overline{UP}$, which are coupled to charge pump 17 and introduce additional delay in delay line 19 for the clock signals passing therethrough. Similarly, flip-flops 31, 32 provide the down steering signals DN2, DN1, which are buffered by gate 37 and inverters 38, 39 to provide the down signals DN, $\overline{DN}$, which are coupled to charge pump 17 and reduce the delay in delay line 19 for the clock signals passing therethrough.

Figure 4:
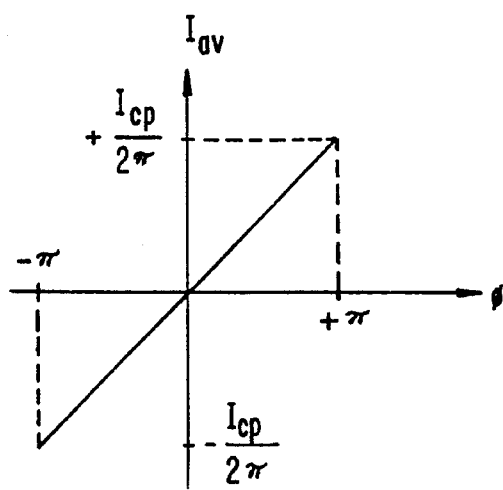
FIG. 4 is a diagram showing the transfer function of phase detector 15 and charge pump 17.

FIG. 4 illustrates the transfer function of the phase detector 15 and associated charge pump 17. In FIG. 4, the abscissa represents the phase error, while the ordinate represents the amount and direction of current associated to a particular degree of phase error. As can be seen, the function is linear and ranges over one full cycle (360°).

Figure 5:
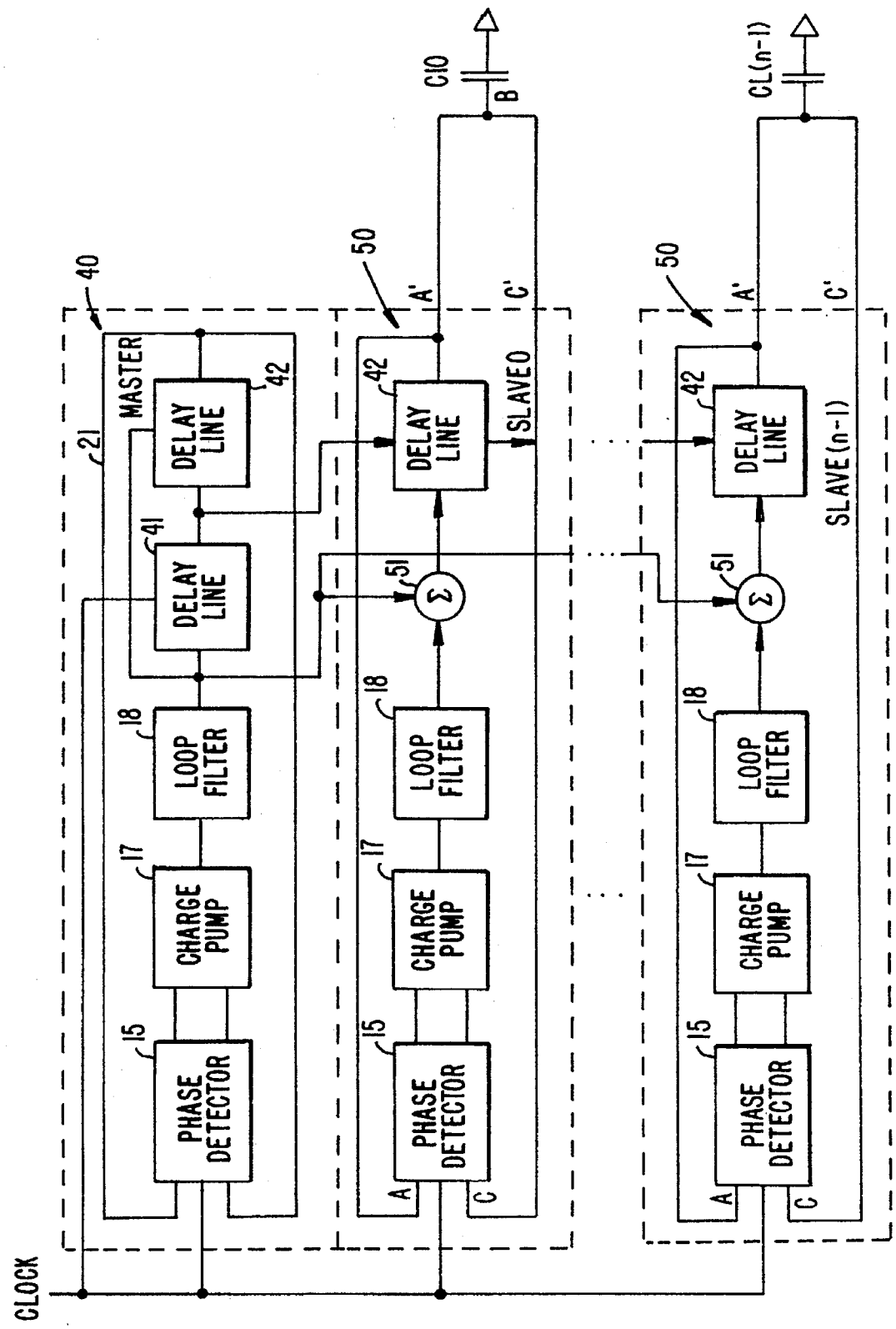
FIG. 5 is a block diagram of a second embodiment of the invention employing master and slave phase correction circuits.

FIG. 5 illustrates an alternate embodiment of the invention in which a master phase correction circuit is used to provide coarse phase correction to other slave phase correction circuits which provide fine phase correction. As seen in this fig., the master phase correction circuit 40 is provided with a phase detector 15, charge pump 17, and loop filter 18 substantially identical in function to those found in the embodiment of FIG. 1 for each phase correction circuit 10. The single delay line 19, however, is replaced with a pair of delay lines 41, 42 which provide coarse and fine delay, respectively. Delay line 41 has a clock signal reference input coupled to common conductor 13, and a control input coupled to the output of loop filter 18. Delay line 42 has a clock signal reference input coupled to the clock signal output of delay line 41, and a control input coupled to the output of loop filter 18. Each slave phase correction circuit 50 is provided with a phase detector 15, charge pump 17, loop filter 18 and delay line 42. Elements 15, 17 and 18 are similar to the same numbered elements in the FIG. 1 embodiment. Delay line 42 is similar to second delay line 42 of the master phase correction circuit 40. In addition, a summing network 51 is provided between loop filter 18 and delay line 42 in each slave circuit 40. In addition to the output from loop filter 18, summing network 51 of the slave phase correction circuits receives the output of loop filter 18 from master phase correction circuit 40 as a first phase correction reference. The output of summing network 51 is coupled as an input to delay line 42. A second input to delay line 42 of each slave circuit 50 is provided from the output of delay line 41 from master phase correction circuit 40.

In the embodiment of FIG. 5, the master phase correction circuit 40 is used to coarse tune the other slave phase correction circuits 50 which results in a simplification of the slave phase correction circuits 50 thus saving integrated circuit device area and power, and also improving performance by reducing the programmability ranges required for the slave delay lines 42. In a typical implementation, the master phase correction circuit 40 provides approximately 70% of the phase correction range for the system clock signal, while the slave correction circuits 50 provide approximately 30% of the phase correction range.

As will now be apparent, the above invention can be readily implemented using conventional integrated circuit techniques and standard cell libraries in integrated circuits requiring a synchronized clock. It should be noted that the invention may be applied to implement on chip clock deskewing or chip-to-chip clock deskewing in which a master clock chip employing the invention may be used to distribute the clock signal to other chips in the system. In an on-chip clock deskewing implementation, the phase correction circuits 10, 40, 50, clock signal conductors 23, 24 and input terminal 12 are all located on the same integrated circuit chip. In a chip-to-chip implementation, the phase correction circuits 10, 40, 50 and the input terminal are all located on a single integrated circuit chip, and at least portions of the clock signal conductors extend from this chip to the other chips in the system. If desired, the master clock generator may also be incorporated onto the single integrated circuit chip. The structure and function of the individual elements 17, 18, 19, 41, 42, and 51 are conventional and thus have not been described in detail in order to avoid prolixity.

The invention affords a number of advantages over known clock deskewing techniques. Firstly, the only constraint on the path length and placement imposed by the invention is that the path length of the outbound conductor 23 of a given pair of clock signal conductors must closely match the path length of the corresponding inbound conductor 24. Compliance with this constraint is relatively simple, for example, by forming a given conductor pair 23, 24 from a single trace in the manner noted above. Consequently, there are no rigid design rules which must be adhered to in order to ensure the delivery of in-phase clock signals to the load device nodes B. In addition, any phase delays introduced by the individual load devices are automatically compensated for by virtue of the distal feedback clock signal from each load device node B to the distal clock signal feedback input terminal C'. Lastly, the invention is stable over a wide range of environmental conditions, and thus provides adaptive clock deskewing.

While the above provides a full and complete understanding of the nature and advantages of the invention, various modifications, alternate constructions and equivalents may be employed, as desired. For example, although the invention has been described with reference to implementations employing delay lock loops, the invention may be employed with phase lock loops having a voltage controlled oscillator instead of a delay line. Consequently, the above should not be construed as limiting the invention, which is defined by the appended claims.

What is claimed is:

1. A clock deskewing circuit for synchronizing a clock signal at destination loads with a system clock, said circuit comprising:

a first input terminal for receiving a system clock signal;

a plurality of pairs of clock signal conductors, each conductor having a path length and having a proximal end and a distal end, the path length of each conductor of a given pair having substantially the same path length, one conductor of each said plurality of pairs providing said system clock signal to a corresponding destination load, the other conductor of each of said plurality of pairs providing a distal clock feedback signal; and a plurality of phase-correction circuits each having a first input coupled to said first input terminal, and second and third inputs coupled to a corresponding pair of said plurality of pairs of clock signal conductors for centering said system clock signal to the corresponding destination load.

2. The invention of claim 1 wherein said plurality of phase correction circuits each includes a phase detector circuit, a charge pump circuit coupled to said phase detector circuit, a loop filter coupled to said charge pump circuit, and a delay line having a first input coupled to said loop filter, a second input coupled to said first input terminal, and an output coupled to the proximal end of the associated one of said clock signal conductors providing said system clock to said load device.

3. The invention of claim 2 wherein each of said plurality of phase correction circuits further includes a conductive lead coupled between the proximal end of said other conductor of the associated pair of clock signal conductors and one of said second and third inputs.

4. A clock deskewing circuit for synchronizing a clock signal at destination loads with a system clock, said circuit comprising:

a first input terminal for receiving a system clock signal;

a plurality of pairs of clock signal conductors, each conductor having a path length and having a proximal end and a distal end, the path length of each conductor of a given pair having substantially the same path length, one conductor of each said plurality of pairs providing said system clock signal to a corresponding destination load, the other conductor of each of said plurality of pairs providing a distal clock feedback signal;

a plurality of phase-correction circuits each having a first input coupled to said first input terminal, and second and third inputs coupled to a corresponding pair of said plurality of pairs of clock signal conductors for centering said system clock signal to the corresponding destination load; and a master phase correction circuit coupled to said first input terminal and to said plurality of phase correction circuits for providing to the plurality of phase correction circuits a master corrected version of said system clock signal for additional phase correction by the plurality of phase correction circuits and a phase correction reference signal for an initial phase correction of the master corrected version of said system clock signal.

5. The invention of claim 4 wherein said master phase correction circuit includes a phase detector circuit, a charge pump circuit coupled to said phase detector circuit, a loop filter having an input coupled to said charge pump and an output, a first delay line having a first input coupled to the output of said loop filter, a second input for receiving said system clock signal and an output, and a second delay line having an input coupled to the output of said first delay line and an output, the output of said second delay line being coupled to said phase detector circuit, the output of said loop filter and said first delay line being coupled to said plurality of phase correction circuits.

6. The invention of claim 5 wherein each of said plurality of phase correction circuits includes a phase detector circuit; a charge pump circuit coupled to said phase detector circuit; a loop filter coupled to said charge pump circuit; a delay line having a first input, a second input, and an output coupled to the proximal end of the associated one of said clock signal conductors providing said system clock signal to the corresponding destination load; and a summing junction having a first input coupled to the output of said loop filter, a second input coupled to the output of the loop filter of said master phase correction circuit, and an output coupled to the first input of said delay line; said second input of said delay line of each of said plurality of phase correction circuits being coupled to the output of said first delay line of said master phase correction circuit.

7. In the invention of claim 1 wherein said first input terminal, said plurality of pairs of clock signal conductors and said plurality of phase correction circuits are all located on a single integrated circuit chip to provide on-chip deskewing of the system clock.

8. The invention of claim 1 wherein said plurality of phase correction circuits are all located on a master clock integrated circuit chip; and wherein said plurality of pairs of clock signal conductors include segments extending from said master clock integrated circuit chip to other integrated circuit chips in order to provide chip-to-chip clock deskewing.

9. A circuit for synchronizing a clock signal at a destination load with a system clock, said circuit comprising:

a first input terminal for receiving a system clock signal;

a first pair of clock signal conductors, each conductor having a path length and having a proximal end and a distal end, the path length of each conductor of the first pair having substantially the same path length, one conductor of the first pair providing said system clock signal to a first destination load, the other conductor of the first pair providing a distal dock feedback signal; and a first phase-correction circuit having a first input coupled to said first input terminal, and second and third inputs coupled to a corresponding conductor of the first pair of clock signal conductors for centering the system clock signal to the first destination load.

10. The circuit of claim 9, further comprising:

a second pair of clock signal conductors, each conductor having a path length and having a proximal end and a distal end, the path length of each conductor of the second pair having substantially the same path length, one conductor of the second pair providing said system clock signal to a second destination load, the other conductor of the second pair providing a distal clock feedback signal; and a second phase-correction circuit having a first input coupled to said first input terminal, and second and third inputs coupled to a corresponding conductor of the second pair of clock signal conductors for centering the system clock signal to the second destination load.

11. A method for providing a circuit for synchronizing a clock signal at a destination load with a system clock, the method comprising the steps of:

providing a first input terminal for receiving a system clock signal;

providing a first pair of clock signal conductors, each conductor having a path length and having a proximal end and a distal end, the path length of each conductor having substantially the same path length, one conductor providing said system clock signal to a first destination load, the other conductor providing a distal clock feedback signal; and providing a phase-correction circuit having a first input coupled to said first input terminal, and second and third inputs coupled to a corresponding conductor of the first pair of clock signal conductors for centering said system clock signal to the first destination load.

12. The method of claim 11, further comprising the steps of:

providing a second pair of clock signal conductors, each conductor having a path length and having a proximal end and a distal end, the path length of each conductor having substantially the same path length, one conductor providing said system clock signal to a second destination load, the other conductor providing a distal clock feedback signal; and providing a phase-correction circuit having a first input coupled to said first input terminal, and second and third inputs coupled to a corresponding conductor of the second pair of clock signal conductors for centering said system clock signal to the second destination load.

13. A method for synchronizing a clock signal at a destination load with a system clock signal, the method comprising the steps of:

receiving the system clock signal along a first conductor;

centering the system clock signal between feedback signals from proximal ends of a first pair of clock signal conductors of substantially equal length, the first pair of dock signal conductors coupled at its distal ends to a first load.

14. The method of claim 13, further comprising the step of:

centering the system clock signal between feedback signals from proximal ends of a second pair of clock signal conductors of substantially equal length, the second pair of clock signal conductors coupled at its distal ends to a second load.

\* \* \* \* \*